(12) United States Patent
Kang et al.

(10) Patent No.: US 12,107,009 B2
(45) Date of Patent: Oct. 1, 2024

(54) METHOD OF DICING WAFER FORMING MODIFIED LAYER IN CHUCKED WAFER

(71) Applicant: SK hynix Inc., Icheon-si (KR)

(72) Inventors: Min Gyu Kang, Icheon-si (KR); Jung Jin Lee, Icheon-si (KR)

(73) Assignee: SK hynix Inc., Incheon-si (KR)

( * ) Notice: Subject to any disclaimer, the term of this patent is extended or adjusted under 35 U.S.C. 154(b) by 707 days.

(21) Appl. No.: 17/388,779

(22) Filed: Jul. 29, 2021

(65) Prior Publication Data

US 2022/0172993 A1    Jun. 2, 2022

(30) Foreign Application Priority Data

Dec. 2, 2020    (KR) ........................ 10-2020-0167022

(51) Int. Cl.
*H01L 21/78* (2006.01)
*B23K 26/364* (2014.01)
*B23K 26/53* (2014.01)
*H01L 21/683* (2006.01)

(52) U.S. Cl.
CPC ............ *H01L 21/78* (2013.01); *B23K 26/364* (2015.10); *B23K 26/53* (2015.10); *H01L 21/6838* (2013.01)

(58) Field of Classification Search
CPC ................ H01L 21/78; H01L 21/6838; H01L 21/67092; H01L 21/3043; H01L 21/268; H01L 21/304; H01L 21/6836; H01L 2221/68327; B23K 26/364; B23K 26/53; B23K 2103/56

See application file for complete search history.

(56) References Cited

U.S. PATENT DOCUMENTS

| 7,666,760 B2 | 2/2010 | Nakamura |
| 8,642,920 B2 | 2/2014 | Aikawa et al. |
| 10,615,075 B2 | 4/2020 | Cayabyab et al. |
| 2008/0145957 A1* | 6/2008 | Lee ................... H01L 21/67742 414/217 |
| 2022/0193826 A1* | 6/2022 | Yamamoto ............. B23K 26/53 |
| 2022/0339740 A1* | 10/2022 | Bernard ............. B23K 26/0608 |

* cited by examiner

*Primary Examiner* — John P. Dulka
(74) *Attorney, Agent, or Firm* — WILLIAM PARK & ASSOCIATES LTD.

(57) ABSTRACT

A method of dicing a wafer includes fixing a second portion of a wafer to a wafer chuck without fixing a first portion of the wafer to the wafer chuck and forming first modified portions in first scribe lane regions of the first portion of the wafer by sequentially laser irradiating the first scribe lane regions without the first portion of the wafer being fixed to the wafer chuck. The method also includes fixing a first portion of the wafer to the wafer chuck and unfixing the second portion of the wafer from the wafer chuck and forming second modified portions in second scribe lane regions of the second portion of the wafer by sequentially laser irradiating the second scribe lane regions without the second portion of the wafer being fixed to the wafer chuck.

15 Claims, 17 Drawing Sheets

METHOD OF DICING WAFER FORMING MODIFIED LAYER IN CHUCKED WAFER

CROSS-REFERENCE TO RELATED APPLICATIONS

The present application claims priority under 35 U.S.C 119(a) to Korean Application No. 10-2020-0167022, filed on Dec. 2, 2020, which is incorporated herein by reference in its entirety.

BACKGROUND

1. Technical Field

The present disclosure relates to a semiconductor package technology, and more particularly, to a method of dicing a wafer.

2. Related Art

A wafer may be a substrate on which electronic devices or semiconductor devices are integrated. The wafer may include a semiconductor substrate. After forming semiconductor devices on the wafer, a wafer dicing process of cutting the wafer may be performed. By the wafer dicing process, semiconductor chips may be separated from the wafer.

SUMMARY

An embodiment of the present disclosure is directed to a method of dicing a wafer including a first portion extending from a first edge of the wafer toward a second edge of the wafer, including a second portion extending from the second edge of the wafer toward the first edge of the wafer, and further including first scribe lane regions disposed in the first portion of the wafer. The method includes loading the wafer on a wafer chuck and performing a first chucking of fixing the second portion of the wafer to the wafer chuck without fixing the first portion of the wafer to the wafer chuck. The method also includes performing first laser irradiating of sequentially forming first modified portions in the first scribe lane regions along a first direction from the first edge of the wafer toward the second edge of the wafer. The method further includes separating semiconductor chips from the wafer by growing cracks from the first modified portions to a surface of the wafer.

Another embodiment of the present disclosure is directed to a method of dicing a wafer including a first portion extending from a first edge of the wafer toward a second edge of the wafer, a second portion extending from the second edge of the wafer toward the first edge of the wafer, and a third portion between the first and second portions, and further including first, second, and third scribe lane regions disposed in the first, second, and third portions of the wafer, respectively. The method includes: loading the wafer on a wafer chuck; performing a first chucking of fixing the third portion of the wafer to the wafer chuck without fixing the first and second portions of the wafer to the wafer chuck; performing a first laser irradiating of sequentially forming first modified portions in the first scribe lane regions along a first direction from the first edge of the wafer toward the second edge of the wafer; performing a second laser irradiating of sequentially forming second modified portions in the second scribe lane regions along a second direction from the second edge of the wafer toward the first edge of the wafer; performing a second chucking of fixing the first portion of the wafer to the wafer chuck without fixing the second portion of the wafer to the wafer chuck and unfixing the third portion of the wafer from the wafer chuck; performing a third laser irradiating of forming third modified portions in the third scribe lane regions along a third direction from the second edge of the wafer toward the first edge of the wafer; and separating semiconductor chips from the wafer by growing cracks from the first, second, and third modified portions to a surface of the wafer.

A method of dicing a wafer in accordance with another embodiment of the present disclosure includes fixing a second portion of a wafer to a wafer chuck without fixing a first portion of the wafer to the wafer chuck and forming first modified portions in first scribe lane regions of the first portion of the wafer by sequentially laser irradiating the first scribe lane regions without the first portion of the wafer being fixed to the wafer chuck. The method also includes fixing a first portion of the wafer to the wafer chuck and unfixing the second portion of the wafer from the wafer chuck and forming second modified portions in second scribe lane regions of the second portion of the wafer by sequentially laser irradiating the second scribe lane regions without the second portion of the wafer being fixed to the wafer chuck.

DETAILED DESCRIPTION

Figure 1:
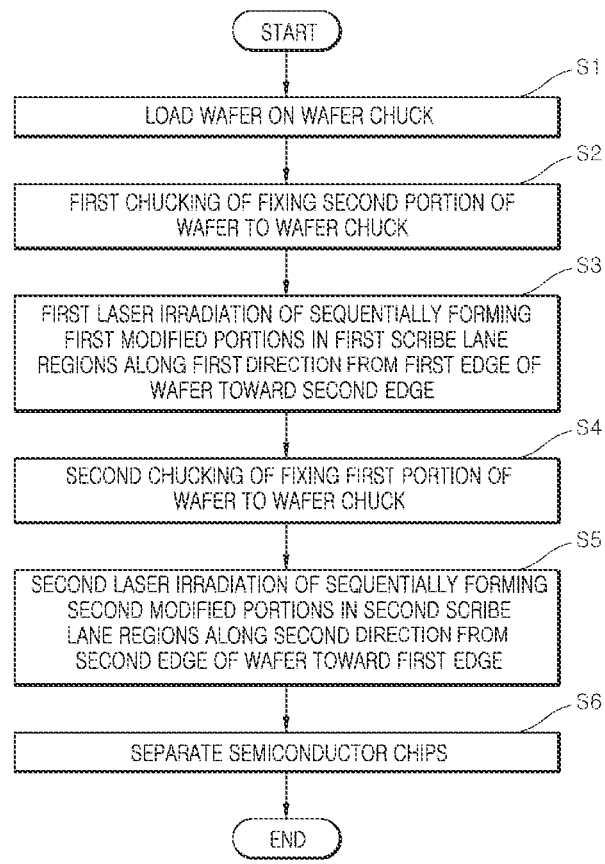
FIG. 1 is a flowchart illustrating a method of dicing a wafer according to an embodiment of the present disclosure.

The terms used herein may correspond to words selected in consideration of their functions in presented embodiments, and the meanings of the terms may be construed to be different according to those of ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

In the description of embodiments of the present disclosure, descriptions such as "first" and "second," "upper" and "lower," and "left" and "right" are for distinguishing members, and are not used to limit the members themselves or to mean a specific order.

A semiconductor device may include a semiconductor substrate or a structure in which a plurality of semiconductor substrates are stacked. A semiconductor device may indicate a semiconductor package structure in which semiconductor substrates are stacked and packaged. A semiconductor substrate may indicate a semiconductor wafer, a semiconductor die, or a semiconductor chip in which electronic components and devices are integrated. A semiconductor chip may indicate memory chips in which memory integrated circuits such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processor such as application processors (Aps), graphic processing units (GPUs), central processing units (CPUs) or system-on-chips (SoCs). The semiconductor devices may be employed in information communication systems such as mobile phones, electronic systems associated with biotechnology or health care, or wearable electronic systems. Semiconductor packages may be applicable to internet of things (IoT).

Same reference numerals refer to same devices throughout the specification. Even though a reference numeral might not be indicated or described with reference to a drawing, the reference numeral may be indicated or described with reference to another drawing. In addition, even though a reference numeral might not be shown in a drawing, it may be shown in another drawing.

Figure 2:
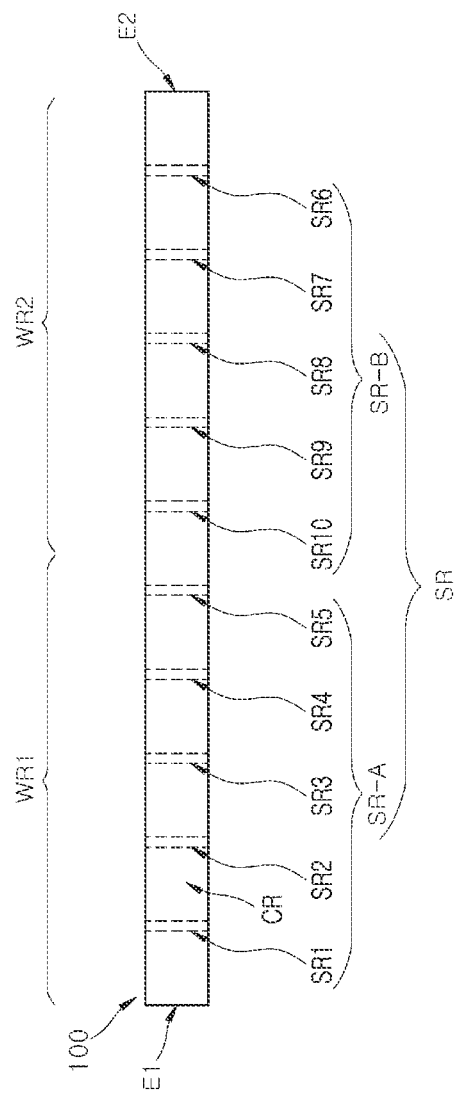
FIG. 2 is a cross-sectional view illustrating a wafer according to an embodiment of the present disclosure.
Figure 3:
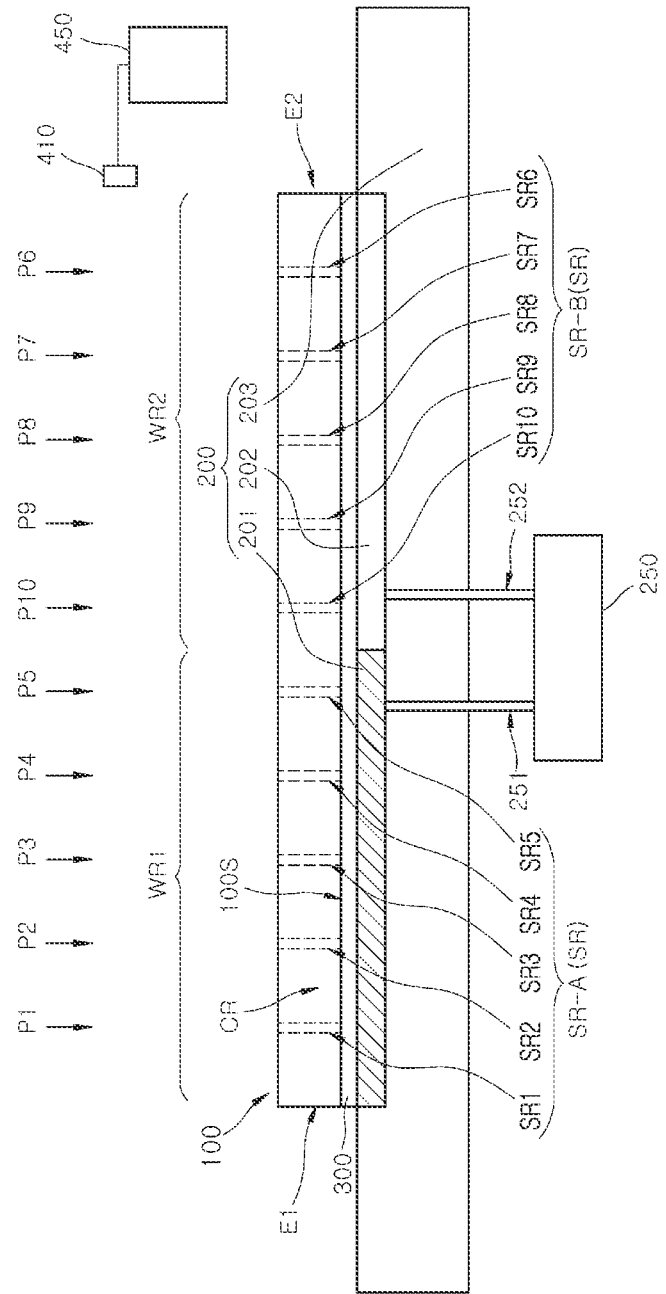
FIG. 3 is a view illustrating a shape in which a wafer is loaded on a wafer chuck according to an embodiment of the present disclosure.

FIG. 1 is a flowchart illustrating a method of dicing a wafer according to an embodiment of the present disclosure. FIG. 2 is a cross-sectional view illustrating a wafer 100 according to an embodiment of the present disclosure. FIG. 3 is a view illustrating a shape in which the wafer 100 is loaded on a wafer chuck 200 according to an embodiment of the present disclosure.

Referring to FIG. 1, the method of dicing a wafer may be performed by cutting the wafer to separate the wafer into semiconductor chips. A laser may be used in the process of separating individual semiconductor chips from the wafer. The method of dicing a wafer may be performed using a stealth dicing process.

Referring to FIG. 2, the wafer 100 may be a work piece on which the wafer dicing method is to be performed. The wafer 100 may be a semiconductor wafer formed of or including a semiconductor material. The wafer 100 may include a semiconductor substrate on which semiconductor devices or integrated circuits are integrated. The wafer 100 may have a shape of a substrate including a first edge E1 and a second edge E2.

The first edge E1 and the second edge E2 may be edges facing each other or edges opposite to each other. The wafer 100 may include a plurality of scribe lane regions SR and a plurality of chip regions CR between the first edge E1 and the second edge E2. The chip regions CR may indicate regions to be separated into individual semiconductor chips. The chip regions CR may be regions in which semiconductor devices or integrated circuits are integrated. The scribe lane regions SR may be disposed between the chip regions CR. The chip regions CR may be regions partitioned by the scribe lane regions SR. The scribe lane regions SR may be regions to be removed by a wafer dicing process. As the scribe lane regions SR are removed, the chip regions CR may be separated from the wafer into semiconductor chips.

The wafer 100 may include a first portion WR1 and a second portion WR2. The first portion WR1 and the second portion WR2 of the wafer may indicate different regions of the wafer 100. The first portion WR1 may indicate a region extending from the first edge E1 toward the second edge E2, and the second portion WR2 of the wafer may indicate a region extending from the second edge E2 toward the first edge E1.

The first portion WR1 of the wafer may include a plurality of first scribe lane regions SR-A. The plurality of first scribe lane regions SR-A may be disposed in the wafer first region WR1 while being spaced apart from each other. The first scribe lane regions SR-A may include first, second, third, fourth, and fifth sub-scribe lane regions SR1, SR2, SR3, SR4, and SR5. The first, second, third, fourth, and fifth sub-scribe lane regions SR1, SR2, SR3, SR4, and SR5 may be sequentially disposed from the first edge E1 of the wafer 100 toward the second edge E2.

The second portion WR2 of the wafer may include a plurality of second scribe lane regions SR-B. The second scribe lane regions SR-B may include sixth, seventh, eighth, ninth, and tenth sub-scribe lane regions SR6, SR7, SR8, SR9, and SR10. The sixth, seventh, eighth, ninth, and tenth sub-scribe lane regions SR6, SR7, SR8, SR9, and SR10 may be sequentially disposed from the second edge E2 of the wafer 100 toward the first edge E1.

Referring to FIGS. 1 to 3, the wafer dicing method may include a step S1 of loading the wafer 100 on the wafer chuck 200. A lamination film 300 may be further attached on a surface 100S of the wafer 100 facing the wafer chuck 200. The lamination film 300 may include an expansion film that can be expanded by a tensile force.

The wafer chuck 200 may include a first portion 201, a second portion 202, and a chuck body 203. The first portion 201 of the wafer chuck and the second portion 202 of the wafer chuck may be portions in which an operation of grabbing and chucking the loaded wafer 100 with a vacuum suction force is performed. The wafer 100 may be fixed to the wafer chuck 200 by the chucking operation.

A chuck controller 250 may turn on or off vacuum suction forces provided to the first portion 201 of the wafer chuck and the second portion 202 of the wafer chuck. The first portion 201 of the wafer chuck and the second portion 202 of the wafer chuck may perform chucking operations independently of each other. The chuck controller 250 may control the chucking operations so that a vacuum suction force is generated only in the first portion 201 of the wafer chuck by opening a first vacuum path 251 connected to the first portion 201 of the wafer chuck and closing a second vacuum path 252 connected to the second portion 202 of the wafer chuck. The chuck controller 250 may control the chucking operations so that a vacuum suction force is generated only in the second portion 202 of the wafer chuck by opening the second vacuum path 252 connected to the second portion 202 of the wafer chuck and closing the first vacuum path 251 connected to the first portion 201 of the wafer chuck. By performing an evacuation operation through the first or second vacuum path 251 or 252 by a vacuum pump (not illustrated), a vacuum suction force may be generated on the first portion 201 of the wafer chuck or the second portion 202 of the wafer chuck. As described above, for example, a portion of a wafer can be fixed to a wafer by generating a vacuum between the portion of the wafer and the wafer chuck. A portion of the wafer can also be unfixed from the wafer chuck by opening a vacuum path to release the vacuum fixing the portion of the wafer to the wafer chuck. In other embodiments, a force other than a vacuum force may fix a portion of a wafer to a wafer chuck.

A laser irradiator 410 may be introduced over the wafer chuck 200. The laser irradiator 410 may be an element that irradiates a laser onto the wafer 100. The laser irradiated inside the wafer 100 may be focused, and the focused portion inside the wafer 100 may be modified to form a modified portion. The modified portion may be a portion having a crystal state different from that of the wafer 100. When the wafer 100 has a single crystalline state, the modified portion may have a polycrystalline state.

A laser controller 450 may control a laser irradiation operation of the laser irradiator 410. The laser controller 450 may turn on or off the laser irradiation operation, or control a position to which the laser irradiator 410 irradiates a laser. Wafer dicing equipment may include the wafer chuck 200, the chuck controller 250, the laser irradiator 410, and the laser controller 450. The wafer dicing processes of FIG. 1 may be performed using the wafer dicing equipment.

Information on positions on which the laser is to be irradiated may include positions of the scribe lane regions SR of the wafer 100. Positions P1, P2, P3, P4, and P5 overlapping with first, second, third, fourth, and fifth sub-scribe lane regions SR1, SR2, SR3, SR4, and SR5, respectively, may be collected from the wafer 100. Positions P6, P7, P8, P9, and P10 overlapping with sixth, seventh, eighth, ninth, and tenth sub-scribe lane regions SR6, SR7, SR8, SR9, and SR10, respectively, may be collected from the wafer 100. The collected position information may be transmitted to the laser controller 450. The laser controller 450 may control the movement of the laser irradiator 410 using the collected position information so that the laser irradiator 410 is positioned at a position to be irradiated by the laser.

Figure 4:
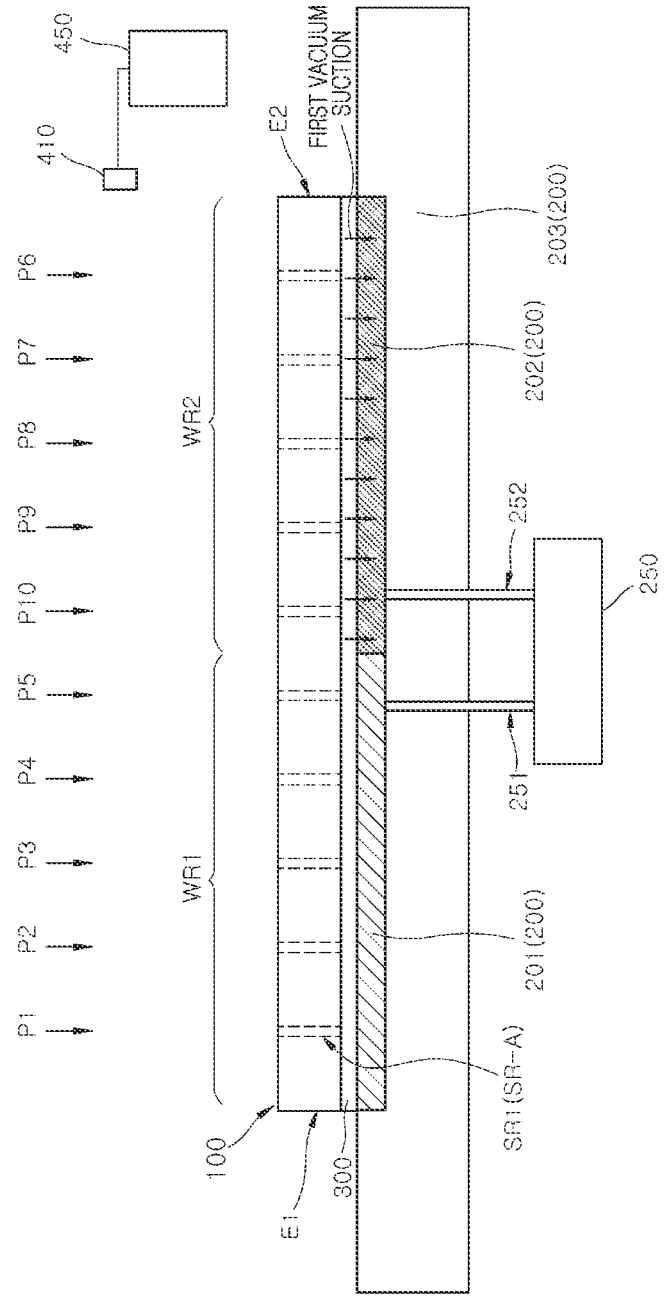
FIG. 4 is a view illustrating a shape in which a wafer is first chucked on a wafer chuck according to an embodiment of the present disclosure.

FIG. 4 is a view illustrating a shape in which the wafer 100 is first chucked on the wafer chuck 200 according to an embodiment of the present disclosure.

Referring to FIGS. 4 and 1, a first chucking step S2 of fixing the second portion WR2 of the wafer to the wafer chuck 200 may be performed. The first chucking step S2 may be performed so that the first portion WR1 of the wafer is not fixed to the wafer chuck 200. The chuck controller 250 may open the second vacuum path 252 connected to the second portion 202 of the wafer chuck and close the first vacuum path 251 connected to the first portion 201 of the wafer chuck, so that a vacuum suction force may be applied only to the second portion 202 of the wafer chuck. Accordingly, only the second portion WR2 of the wafer may be selectively fixed to the second portion 202 of the wafer chuck by first vacuum suction.

Figure 5:
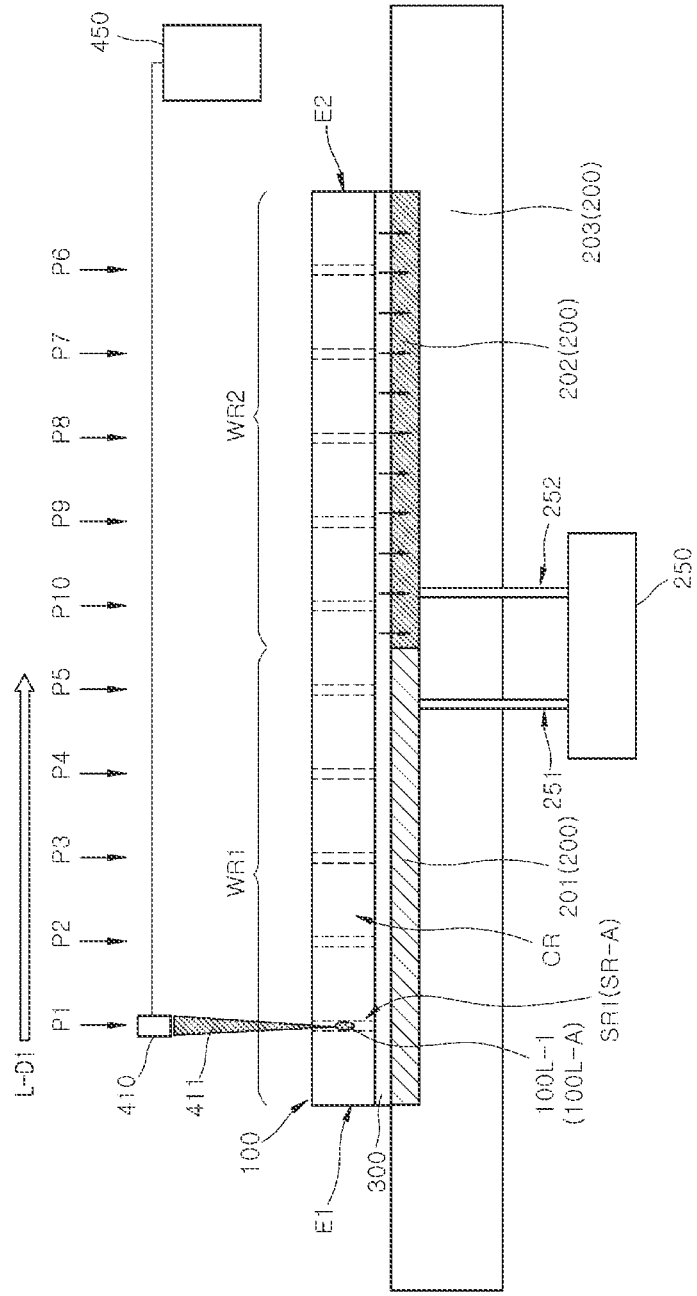
FIGS. 5 to 8 are views illustrating steps of forming first modified portions in a wafer according to an embodiment of the present disclosure.
Figure 6:
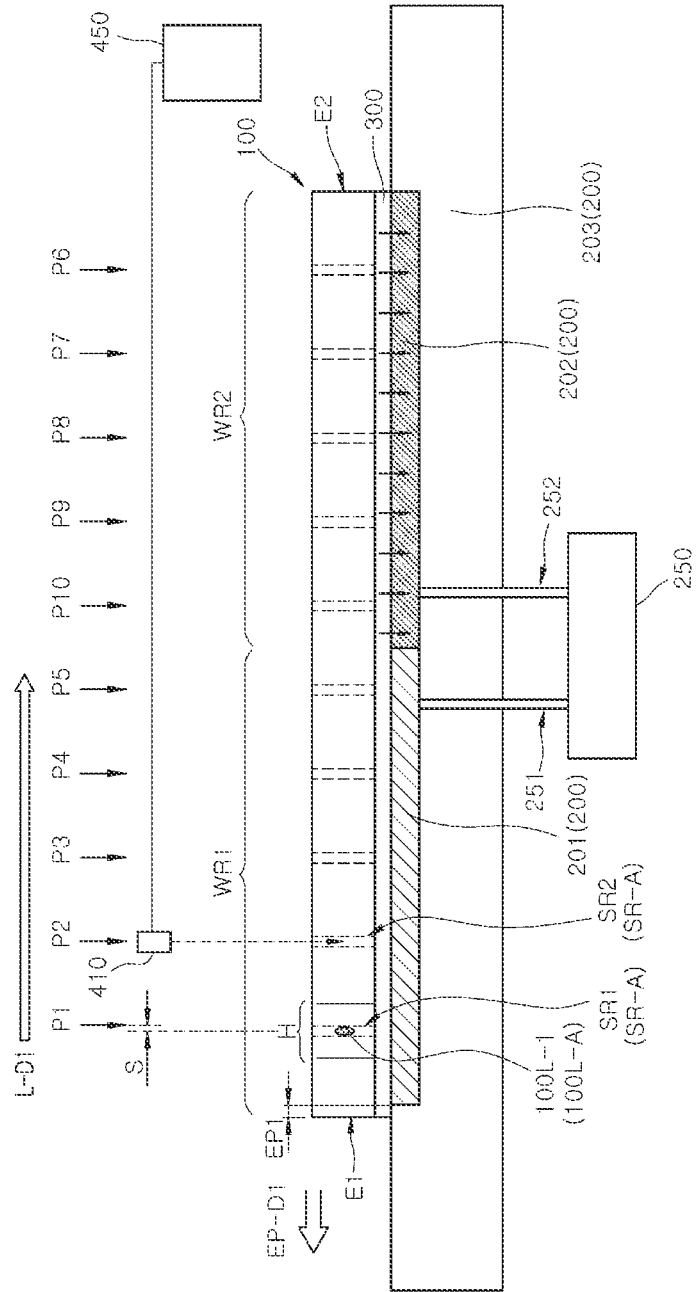
Figure 7:
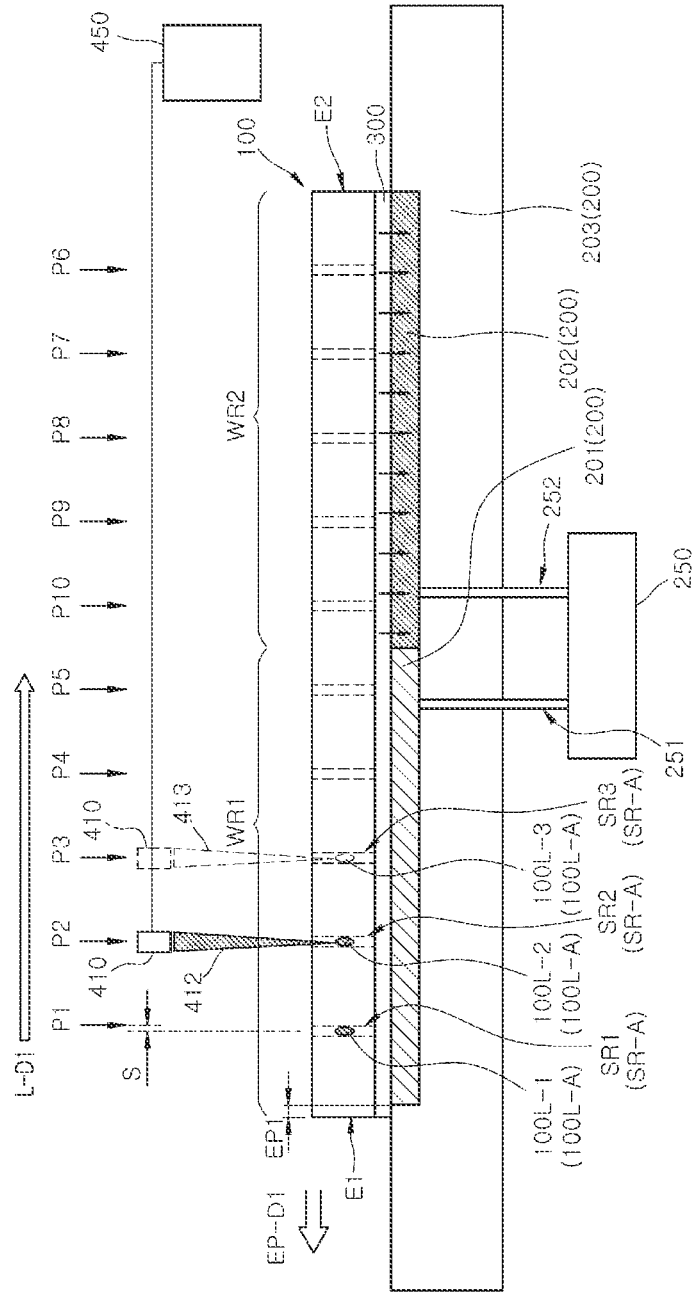
Figure 8:
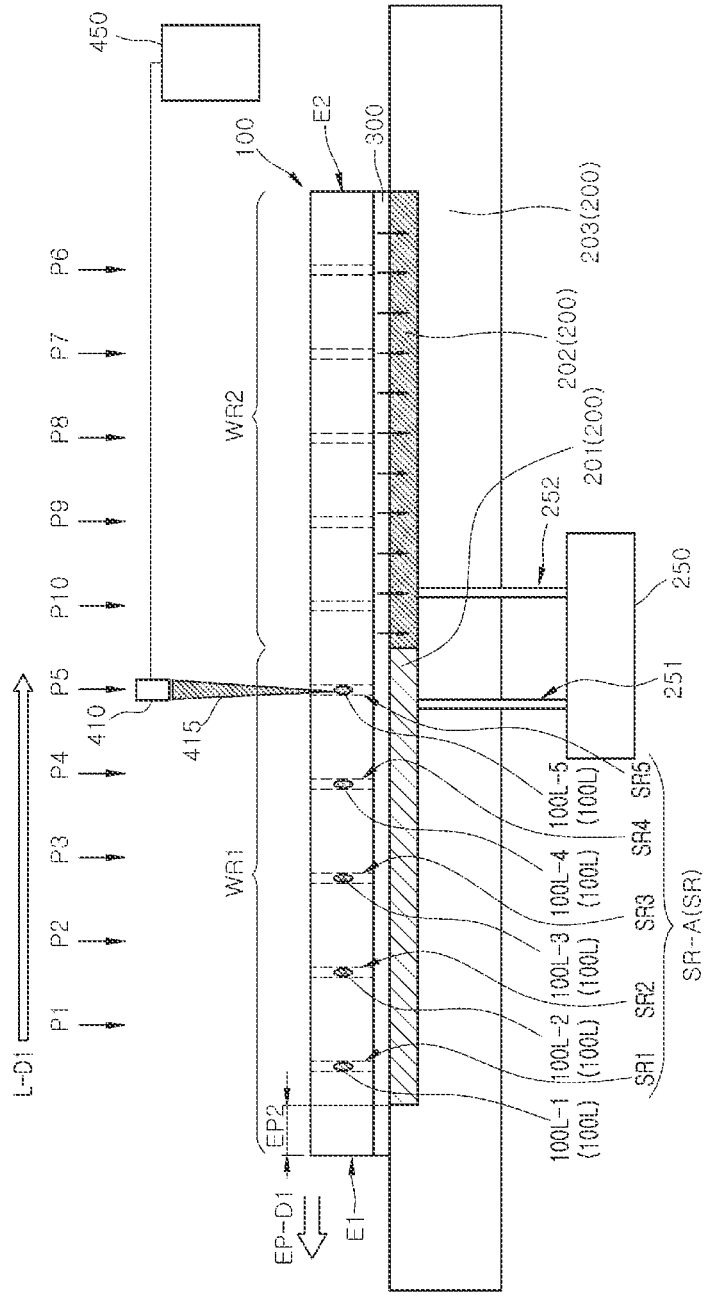

FIGS. 5 to 8 are views illustrating steps of forming first modified portions 100L-A in the wafer 100 according to an embodiment of the present disclosure. FIG. 5 is a view illustrating a step of irradiating a first sub-laser 411 on the wafer 100 according to an embodiment. FIG. 6 is a view illustrating the positional movement of the first sub-scribe lane region SR1 of the wafer 100 according to an embodi-ment. FIG. 7 is a view illustrating a step of irradiating a second sub-laser 412 on the wafer 100 according to an embodiment. FIG. 8 is a view illustrating a step of irradiating a fifth sub-laser 415 on the wafer 100 according to an embodiment.

Referring to FIGS. 5 to 8 together with FIG. 1, a first laser irradiation step S3 of forming the first modified portion 100L-A in each of the first scribe lane regions SR-A may be performed. The sub-lasers (411 in FIGS. 5, 412 and 413 in FIG. 7) may be sequentially irradiated along a first direction L-D1 from the first edge E1 of the wafer 100 to the second edge E2. The sub-lasers 411, 412, and 413 may form the first modified portion 100L-A in each of the first scribe lane regions SR-A. For an embodiment, the sub-lasers 411, 412, and 413 represent separate irradiations from the laser irradiator 410.

Referring to FIG. 5, the first laser irradiation step S3 may include a step of irradiating the first sub-laser 411 onto a first sub-scribe lane region SR1. Referring to FIG. 7, the first laser irradiation step S3 may further include a step of irradiating the second sub-laser 412 onto a second sub-scribe lane region SR2. The first laser irradiation step S3 may further include a step of irradiating the third sub-laser 413 onto a third sub-scribe lane region SR3. The steps of irradiating the first, second, and third sub-lasers 411, 412, and 413 may be sequentially performed along the first direction L-D1.

Referring again to FIG. 5, the laser irradiator 410 may be located at the first position P1 over the wafer 100. At the first position P1, the laser irradiator 410 may irradiate the first sub-laser 411 onto the first sub-scribe lane region SR1. By irradiating the first sub-laser 411, a first sub-modified portion 100L-1 may be formed in the first sub-scribe lane region SR1. The first sub-laser 411 may heat a portion of the first sub-scribe lane region SR1. The crystal state of the portion heated by the first sub-laser 411 may be modified.

Referring to FIGS. 5 and 6, while the first sub-laser 411 forms the first sub-modified portion 100L-1, heat associated with the first sub-laser 411 may be accumulated in a local region H. The local region H may be a region adjacent to the first sub-modified portion 100L-1. The local region H may be thermally expanded by the accumulated heat. The local region H may be thermally expanded in a first expansion direction EP-D1, which is a direction from the second edge E2 of the wafer to the first edge E1.

The first region WR1 of the wafer is not fixed to the wafer chuck 200 and may be moved freely, and the local region H is included in the first region WR1 of the wafer. Because the second region WR2 of the wafer is fixed to the second portion 202 of the wafer chuck, thermal expansion of the local region H toward the second region WR2 of the wafer may be limited. The thermal expansion of the local region H may occur in the first expansion direction EP-D1 that is opposite to the fixed second region WR2 of the wafer. The first expansion direction EP-D1 may be the same as the direction from the second edge E2 of the wafer to the first edge E1.

Because the thermal expansion of the local region H occurs along the first expansion direction EP-D1, the first edge E1 of the wafer 100 may be shifted from an initial position by a first expansion distance EP1 in the first expansion direction EP-D1. Because the first sub-modified portion 100L-1 is located in the local region H, as the local region H is thermally expanded, the first sub-modified portion 100L-1 may be located at a position that is moved by a certain distance S from the initial position in the first expansion direction EP-D1. As the local region H is thermally expanded, the first sub-scribe lane region SR1 may be located at a position that is moved by a certain distance S from the initial position in the first expansion direction EP-D1.

Thermal expansion of the local region H may be limited toward the second region WR2 of the wafer. The second sub-scribe lane region SR2 is located closer to the fixed second region WR2 of the wafer than the first sub-scribe lane region SR1. Accordingly, the second sub-scribe lane region SR2 is not substantially affected by the thermal expansion of the local region H. In other words, even if thermal expansion of the local region H occurs, the second sub-scribe lane region SR2 may remain at a position overlapping with the second position P2 as it is. Even if the local region H is thermally expanded, the amount of change in position of the remaining first sub-scribe lane regions SR-A located between the first sub-scribe lane region SR1 and the second portion WR2 of the wafer may be insignificant.

Because the position of the second sub-scribe lane region SR2 is maintained overlapping with the second position P2, the laser irradiator 410 may be substantially accurately aligned with the second sub-scribe lane region SR2 at the second position P2. Accordingly, it is possible to substantially suppress, reduce, or prevent the occurrence of a defect in which the second modified portion is formed outside the second sub-scribe lane region SR2.

Referring to FIG. 7, the laser irradiator 410 may irradiate the second sub-laser 412 onto the second sub-scribe lane region SR2 at the second position P2 over the wafer 100. The second sub-laser 412 may form a second sub-modified portion 100L-2 in a portion of the second sub-scribe lane region SR2. While the second sub-laser 412 forms the second sub-modified portion 100L-2, a local region adjacent to the second sub-modified portion 100L-2 may be thermally expanded. Because the second region WR2 of the wafer is fixed, the expansion of the local region may be limited toward the second region WR2 of the wafer. Accordingly, the third sub-scribe lane region SR3 may be remained at the third position P3. When the laser irradiator 410 moves to the third position P3, the laser irradiator 410 may be substantially accurately aligned with the third sub-scribe lane region SR3.

The laser irradiator 410 may move to the third position P3 over the wafer 100, and irradiate the third sub-laser 413 onto the third sub-scribe lane region SR3 at the third position P3. The third sub-laser 413 may form a third sub-modified portion 100L-3 in a portion of the third sub-scribe lane region SR3.

Referring to FIG. 8, the laser irradiator 410 may move along the first direction L-D1 from the first edge E1 of the wafer 100 to the second edge E2, and sequentially irradiate the sub-laser onto each of the sub-scribe lane regions. The laser irradiator 410 may irradiate a fourth sub-laser onto a fourth sub-scribe lane region SR4 at a fourth position P4 over the wafer 100. The fourth sub-laser may form a fourth sub-modified portion 100L-4 in a portion of the fourth sub-scribe lane region SR4. The laser irradiator 410 may irradiate a fifth sub-laser onto a fifth sub-scribe lane region SR5 at a fifth position P5 over the wafer 100. The fifth sub-laser may form a fifth sub-modified portion 100L-5 in a portion of the fifth sub-scribe lane region SR5.

Due to the localized thermal expansion accompanying the formation of the first, second, third, fourth, and fifth sub-modified portions 100L-1, 100L-2, 100L-3, 100L-4, and 100L-5, the first edge E1 of the wafer may be moved by a second expansion distance EP2 from the initial position in the first expansion direction EP-D1. Despite such localized thermal expansion, because thermal expansion toward the second region WR2 of the wafer is limited, the first, second, third, fourth, and fifth sub-modified portions 100L-1, 100L-2, 100L-3, 100L-4, and 100L-5 may be formed in the corresponding sub-scribe lane regions in which the sub-modified portions are to be formed.

Figure 9:
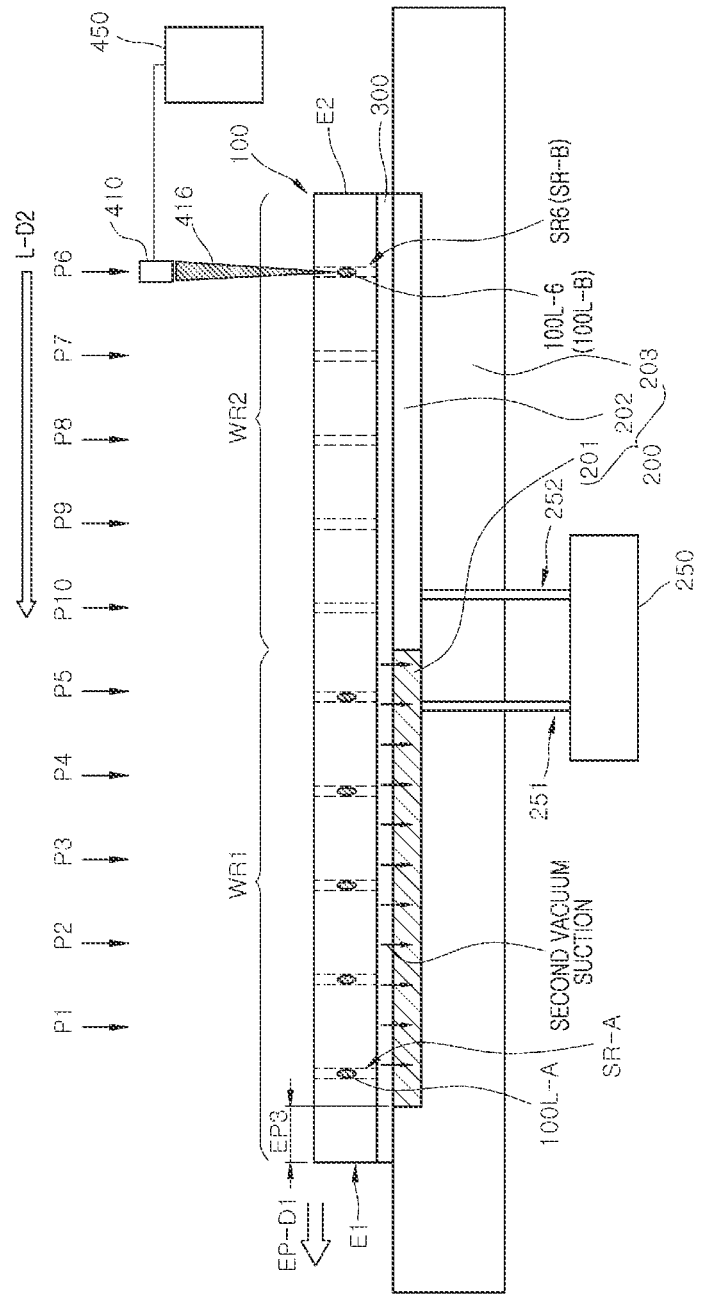
FIGS. 9 and 10 are views illustrating steps of forming second modified portions in a wafer according to an embodiment of the present disclosure.

FIG. 9 is a view illustrating a step of irradiating a sixth sub-laser 416 onto the wafer 100 according to an embodiment of the present disclosure.

Referring to FIGS. 9 and 1, due to local thermal expansions accompanying the formation of the first modified portions 100L-A in the first portion WR1 of the wafer, the first edge E1 of the wafer may be moved by a third expansion distance EP3 in the first expansion direction EP-D1 from the initial position. A second chucking step S4 of fixing the first region WR1 of the wafer to the wafer chuck 200 may be performed. The second chucking step S4 may be performed after forming the first modified portions 100L-A in the first region WR1 of the wafer. The second chucking step S4 may be performed without fixing the second region WR2 of the wafer to the wafer chuck 200.

The second chucking step S4 may include a step of releasing the first vacuum suction for the second region WR2 of the wafer to the second portion 202 of the wafer chuck. In addition, the second chucking step S4 may include a step of fixing the first region WR1 of the wafer to the first portion 201 of the wafer chuck by second vacuum suction. The chuck controller 250 may open the first vacuum path 251 connected to the first portion 201 of the wafer chuck and close the second vacuum path 252 connected to the second portion 202 of the wafer chuck. Accordingly, vacuum suction force may be generated only in the first portion 201 of the wafer chuck. With such operations, only the first region WR1 of the wafer may be fixed to the first portion 201 of the wafer chuck by the second vacuum suction.

A second laser irradiation step S5 of forming a second modified portions 100L-B in the second scribe lane regions SR-B may be performed. The second laser irradiation step S5 may include step of sequentially irradiating lasers along the second direction L-D2 from the second edge E2 of the wafer 100 to the first edge E1. First, as illustrated in FIG. 9, the laser irradiator 410 may irradiate a sixth sub-laser 416 onto the sixth sub-scribe lane region SR6 at the sixth position P6 over the wafer 100. The sixth sub-laser 416 may form a sixth sub-modified portion 100L-6 in the sixth sub-scribe lane region SR6.

Figure 10:
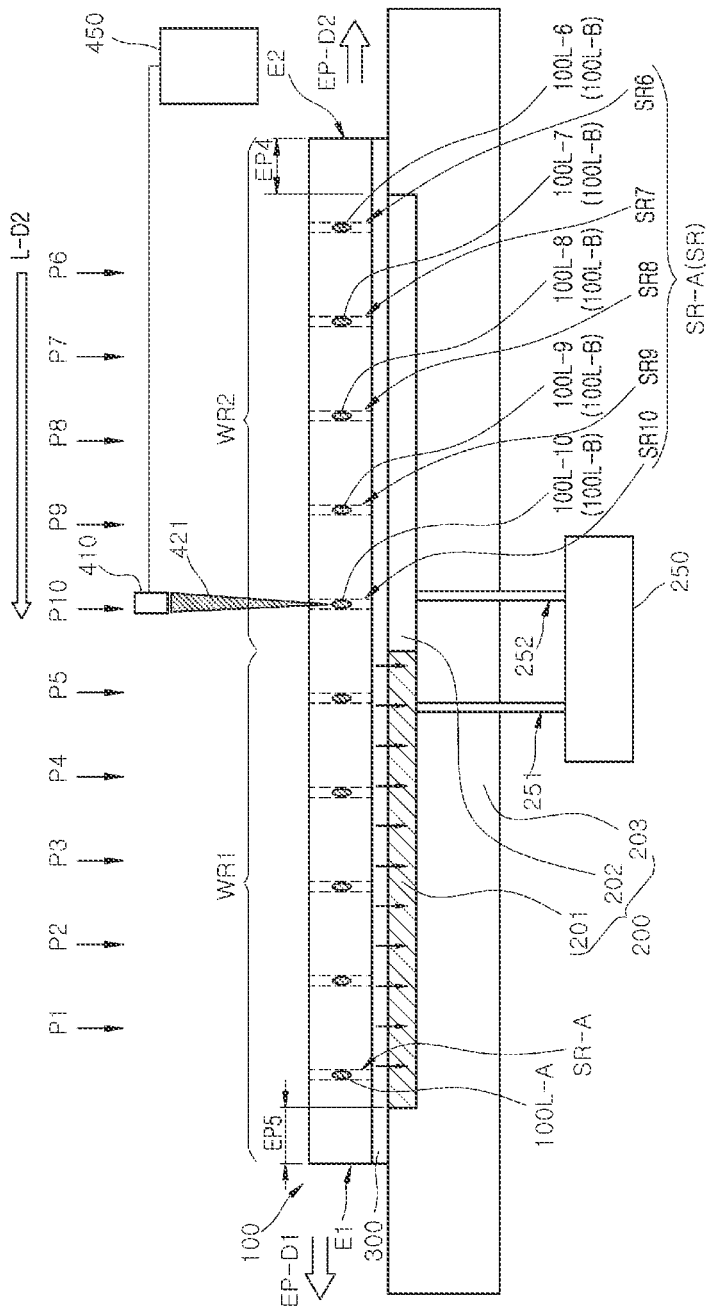

FIG. 10 is a view illustrating a step of irradiating a tenth sub-laser 421 onto the wafer 100 according to an embodiment of the present disclosure.

Referring to FIG. 10, processes of sequentially irradiating lasers may be performed along the second direction L-D2 from the second edge E2 of the wafer 100 to the first edge E1. Accordingly, a second modified portions 100L-B may be formed in the second scribe lane regions SR-B. As illustrated in FIG. 9, after irradiating the sixth sub-laser 416 onto the sixth sub-scribe lane region SR6, the laser irradiator 410 may sequentially move to the seventh position P7, the eighth position P8, and the ninth position P9 over the wafer 100. The laser irradiator 410 may sequentially irradiate the seventh, eighth, and ninth sub-lasers to the seventh, eighth, and ninth sub-scribe lane regions SR7, SR8, and SR9, respectively. Accordingly, seventh, eighth, and ninth sub-modified portions 100L-7, 100L-8, and 100L-9 may be sequentially formed in the seventh, eighth, and ninth sub-scribe lane regions SR7, SR8, and SR9, respectively.

The laser irradiator 410 may move to the tenth position P10 over the wafer 100 and irradiate the tenth sub-laser onto the tenth sub-scribe lane region SR10 at the tenth position P10. The tenth sub-laser may form a tenth sub-modified portion 100L-10 in a portion of the tenth sub-scribe lane region SR10.

As the second modified portions 100L-B are formed in the second scribe lane regions SR-B, thermal expansion may be accompanied locally in the second portion WR2 of the wafer. Because the second portion WR2 of the wafer is in a freely movable state, and the first region WR1 of the wafer is fixed to the wafer chuck 200, the expansion toward the first portion WR1 of the wafer may be limited. In the second expansion direction EP-D2 opposite to the first expansion direction EP-D1, the first portion WR1 of the wafer may be thermally expanded. Because the second modified portions 100L-B are sequentially formed along the second direction L-D2, even if localized thermal expansion occurs, defects in which the generation positions of the second modified portions are varied may be substantially suppressed, reduced, or prevented. The second modified portions 100L-B may be formed in the second scribe lane regions SR-B without departing from the second scribe lane regions SR-B. The positions of the second scribe lane regions SR-B to which the lasers are not irradiated might not be substantially changed by the localized thermal expansion.

As the localized thermal expansion generated when the second modified portions 100L-B are formed are accumulated, the second edge E2 of the wafer may be moved from the initial position in the second expansion direction EP-D2 by a fourth expansion distance EP4.

Figure 11:
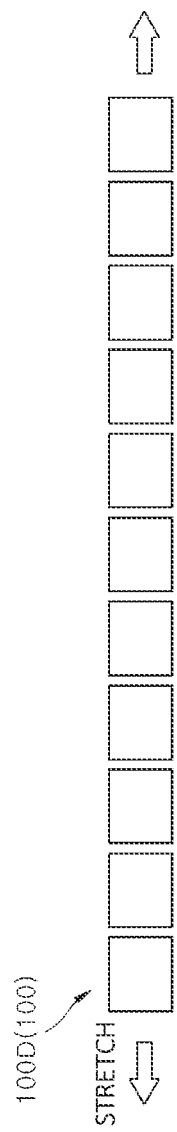
FIGS. 11 to 13 are views illustrating a step of separating semiconductor chips from a wafer according to an embodiment of the present disclosure.
Figure 12:
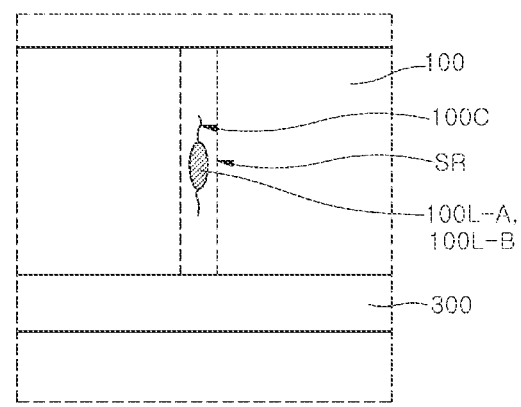
Figure 13:
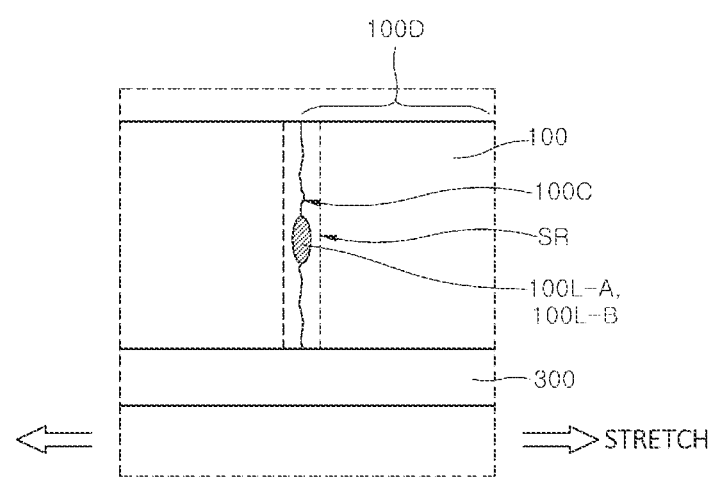

FIG. 11 is a view illustrating a shape in which semiconductor chips 100D are separated from a wafer 100 according to an embodiment of the present disclosure. FIG. 12 is a view illustrating that a crack 100C is generated in the wafer 100 according to an embodiment of the present disclosure. FIG. 13 is a view illustrating growing the crack 100C in the wafer 100 according to an embodiment of the present disclosure.

Referring to FIGS. 11 and 1, the semiconductor chips 100D may be separated (S6) from the wafer 100. By growing cracks from the first and second modified portions 100L-A and 100L-B to a surface of the wafer 100, semiconductor chips 100D may be separated from the wafer 100. It is possible to grow the cracks by stretching the wafer 100.

Referring to FIG. 12, while the first and second modified portions 100L-A and 100L-B are generated in the scribe lane regions SR of the wafer 100, the cracks 100C may be generated or accompanied around the first and second modified portions 100L-A and 100L-B. Each of the first and second modified portions 100L-A and 100L-B may have a crystal state different from that of the wafer 100. For example, if the wafer 100 has a single crystalline state, the crystal state of a portion of the wafer irradiated with the laser may be modified into a polycrystalline state. Because the first and second modified portions 100L-A and 100L-B and the wafer 100 have different crystal states, stress may be generated around the first and second modified portions 100L-A and 100L-B due to the difference in crystal states. This stress may generate the cracks 100C around the first and second modified portions 100L-A and 100L-B.

Referring to FIG. 13, when the wafer 100 is stretched, the cracks 100C may grow by the tensile force. When the cracks 100C grow in the longitudinal and propagate to the surface of the wafer 100, an effect of cutting the wafer 100 may occur. Accordingly, the semiconductor chips 100D may be separated from the wafer 100. It is possible to induce the wafer 100 to be stretched by stretching the lamination film 300 attached to the wafer 100.

Figure 14:
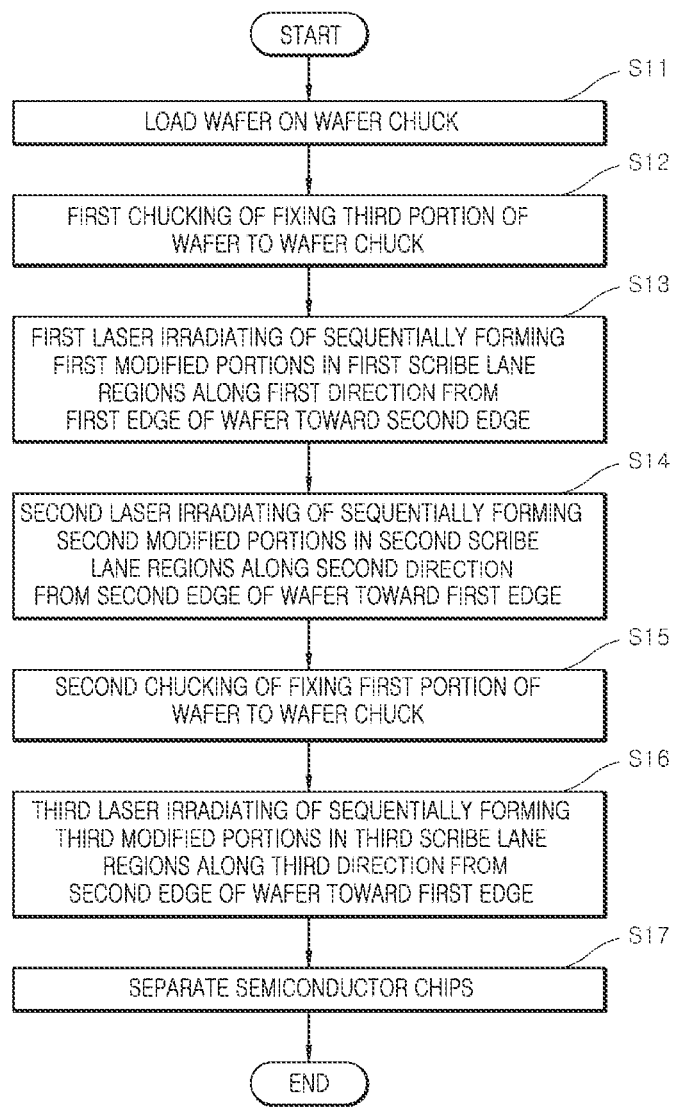
FIG. 14 is a flowchart illustrating a method of dicing a wafer according to an embodiment of the present disclosure.
Figure 15:
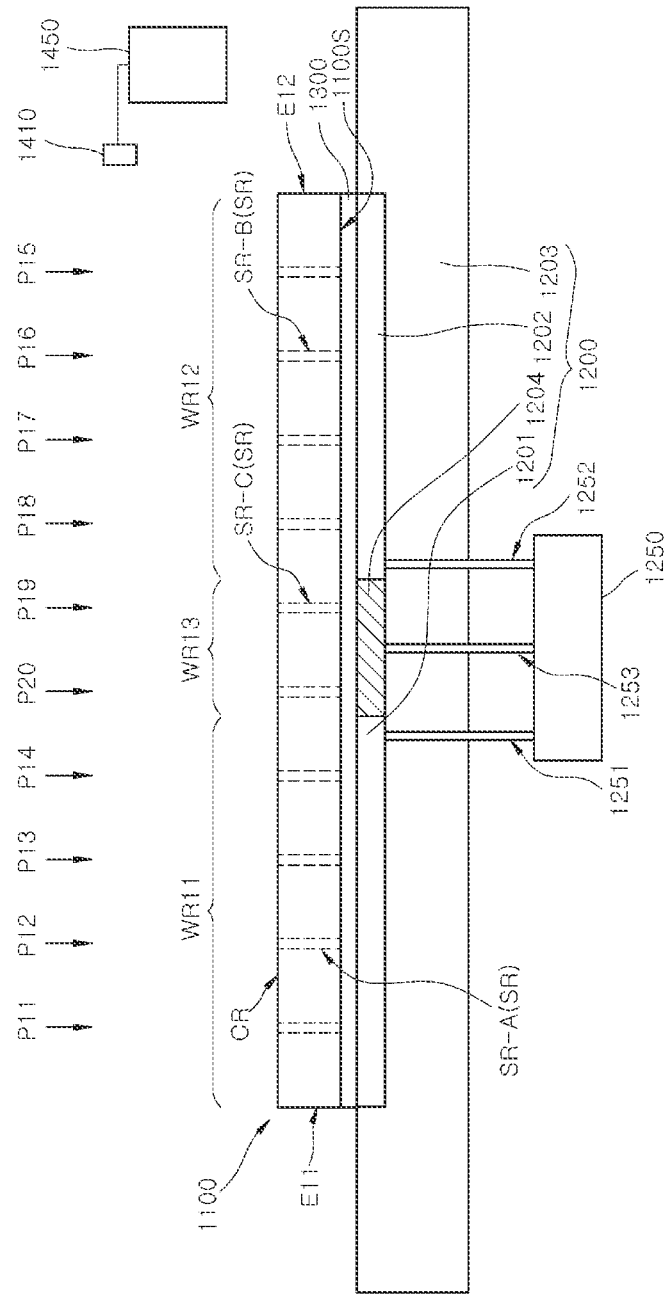
FIG. 15 is a view illustrating a shape in which a wafer is loaded on a wafer chuck according to an embodiment of the present disclosure.

FIG. 14 is a flowchart illustrating a method of dicing a wafer according to an embodiment of the present disclosure. FIG. 15 is a view illustrating a shape in which a wafer 1100 is loaded on a wafer chuck 1200 according to an embodiment of the present disclosure.

Referring to FIGS. 14 and 15, the wafer 1100 may be loaded (S11) on the wafer chuck 1200. A lamination film 1300 may be attached to a surface 1100S of the wafer 1100. The wafer 1100 may have a shape of a substrate including a first edge E11 and a second edge E12. The wafer 1100 may include a plurality of scribe lane regions SR and a plurality of chip regions CR disposed between the first edge E11 and the second edge E12. The wafer 1100 may include a first portion WR11, a second portion WR12, and a third portion WR13. The first portion WR11 of the wafer may indicate a region extending from the first edge E11 toward the second edge E12, and the second portion WR12 of the wafer may indicate a region extending from the second edge E12 toward the first edge E11. The third portion WR13 of the wafer may be positioned between the first portion WR11 and the second portion WR12 of the wafer. The first, second, and third portions WR11, WR12, and WR13 of the wafer may indicate regions that are separated from each other.

First scribe lane regions SR-A may be disposed in the first portion WR11 of the wafer while being spaced apart from each other. Second scribe lane regions SR-B may be disposed in the second portion WR12 of the wafer. Third scribe lane regions SR-C may be disposed in the third portion WR13 of the wafer.

The wafer chuck 1200 may include a first portion 1201, a second portion 1202, a third portion 1204, and a chuck body 1203. The first, second, and third portions 1201, 1202, and 1204 of the wafer chuck may be wafer chuck portions overlapping with first, second, and third portions WR11, WR12, and WR13 of the loaded wafer 1100, respectively. A chuck controller 1250 may turn on or off vacuum suction forces to the first, second, and third portions 1201, 1202, and 1204 of the wafer chuck. Independent chucking operations may be performed in the first, second, and third portions 1201, 1202, and 1204 of the wafer chuck.

The chuck controller 1250 may open a first vacuum path 1251 connected to the first portion 1201 of the wafer chuck and close second and third vacuum paths 1252 and 1253 connected to the second and third portions 1202 and 1204 of the wafer chuck, respectively, so that a vacuum suction force may be generated only in the first portion 1201 of the wafer chuck. The chuck controller 1250 may open the third vacuum path 1253 connected to the third portion 1204 of the wafer chuck and close the second and third vacuum paths 1252 and 1253 connected to the first and second portions 1201 and 1202 of the wafer chuck, respectively, so that a vacuum suction force may be generated only in the third portion 1204 of the wafer chuck.

A laser irradiator 1410 may be introduced over the wafer chuck 1200. A laser controller 1450 may control an operation of irradiating a laser of the laser irradiator 1410. The laser controller 1450 may collect information on positions P11, P12, P13, P14, P20, P19, P18, P17, P16, and P15 to be irradiated with the laser, and control the operation of the laser irradiator 1410 using the collected position information.

Figure 16:
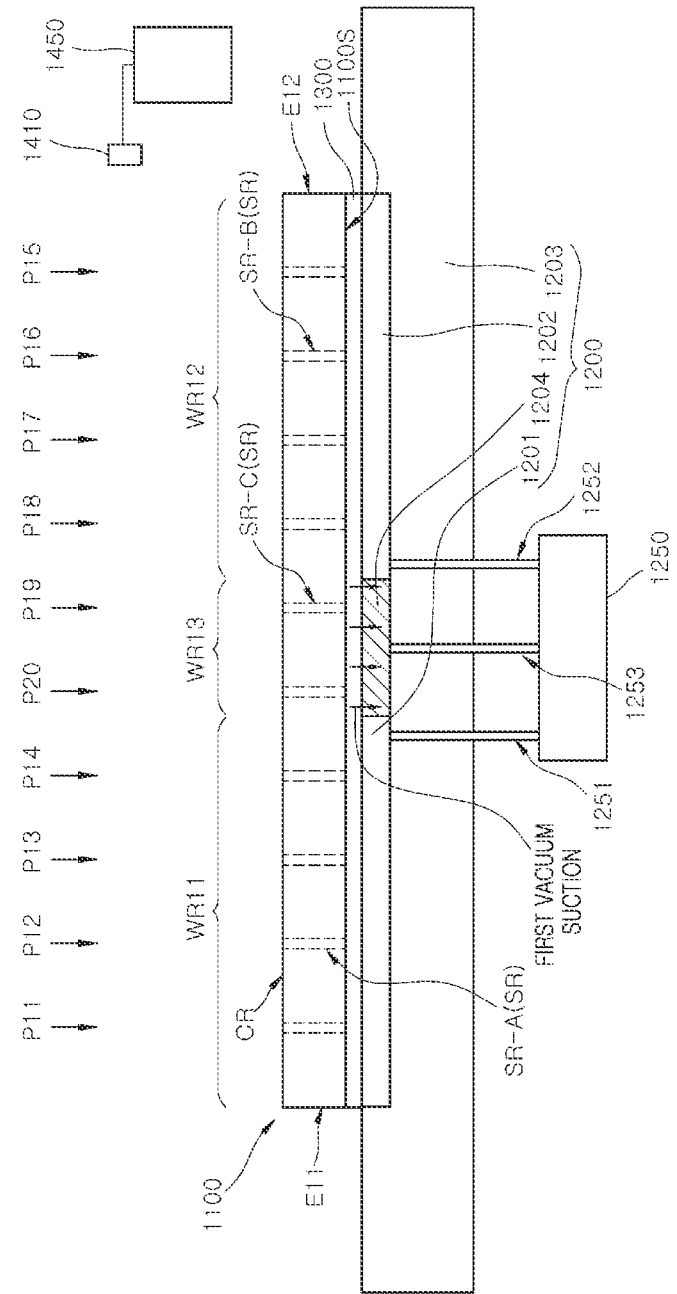
FIG. 16 is a view illustrating a shape in which a wafer is first chucked on a wafer chuck according to an embodiment of the present disclosure.

FIG. 16 is a view illustrating a shape in which the wafer 1100 is first chucked on the wafer chuck 1200 according to an embodiment of the present disclosure.

Referring to FIGS. 16 and 14, a first chucking step S12 of fixing the third portion WR13 of the wafer to the wafer chuck 1200 may be performed. The first chucking step S12 may be performed without fixing the first and second portions WR11 and WR12 of the wafer to the wafer chuck 1200. The chuck controller 1250 may operate to generate a vacuum suction force only in the third portion 1204 of the wafer chuck by opening the third vacuum path 1253 connected to the third portion 1204 of the wafer chuck and closing the first and second vacuum paths 1251 and 1252 connected to the first and second portions 1201 and 1202 of the wafer chuck, respectively. Accordingly, only the third portion WR13 of the wafer may be selectively fixed to the third portion 1204 of the wafer chuck by first vacuum suction.

Figure 17:
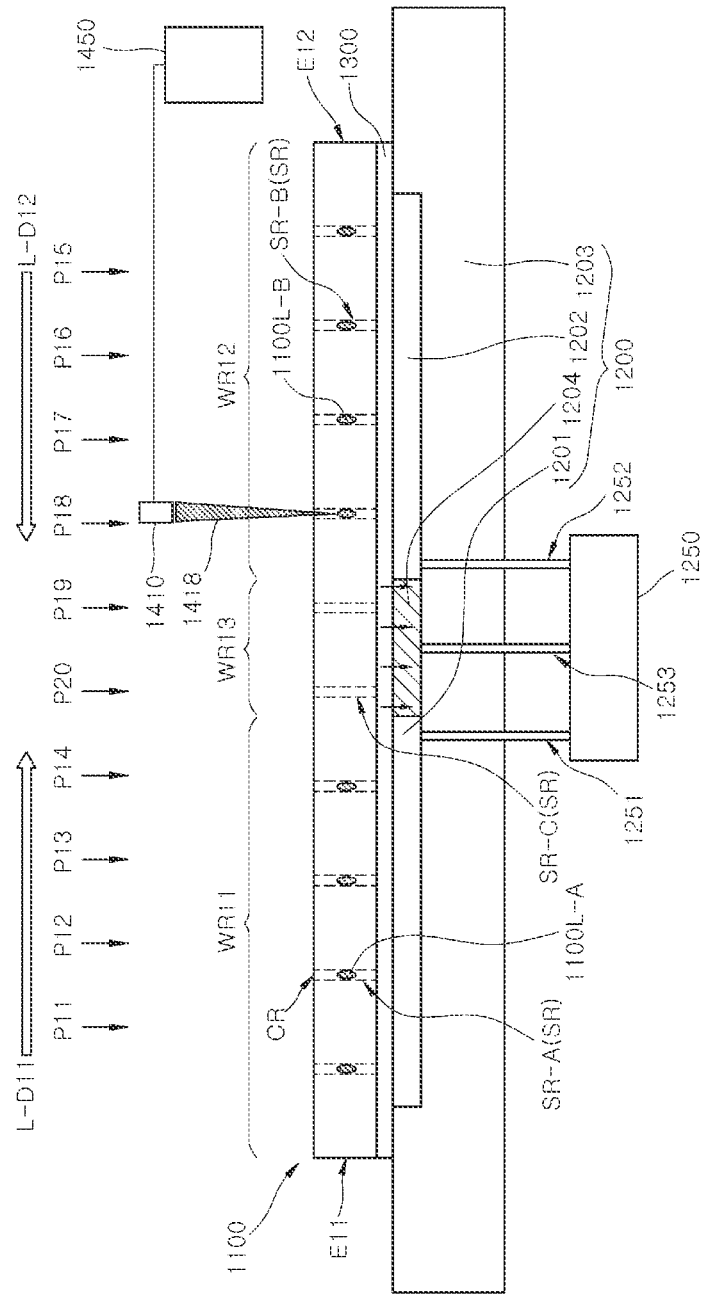
FIG. 17 is a view illustrating a step of forming first and second modified portions in a wafer according to an embodiment of the present disclosure.

FIG. 17 is a view illustrating a step of forming first and second modified portions 1100L-A and 1100L-B in the wafer 1100 according to an embodiment of the present disclosure.

Referring to FIGS. 17 and 14, in a first laser irradiation step S13, the first modified portions 1100L-A may be sequentially formed in the first scribe lane regions SR-A along a first direction L-D11 from the first edge E11 of the wafer 1100 to the second edge E12. The laser irradiator 1410 may sequentially irradiate the lasers to each of the first scribe lane regions SR-A while sequentially moving to the first, second, third, and fourth positions P11, P12, P13, and P14.

In a second laser irradiation step S14, the second modified portions 1100L-B may be sequentially formed in the second scribe lane regions SR-B along a second direction L-D12 from the second edge E12 of the wafer 1100 to the first edge E11. The laser irradiator 1410 may sequentially irradiate the lasers to each of the second scribe lane regions SR-B while sequentially moving to the fifth, sixth, seventh, and eighth positions P15, P16, P17, and P18.

Figure 18:
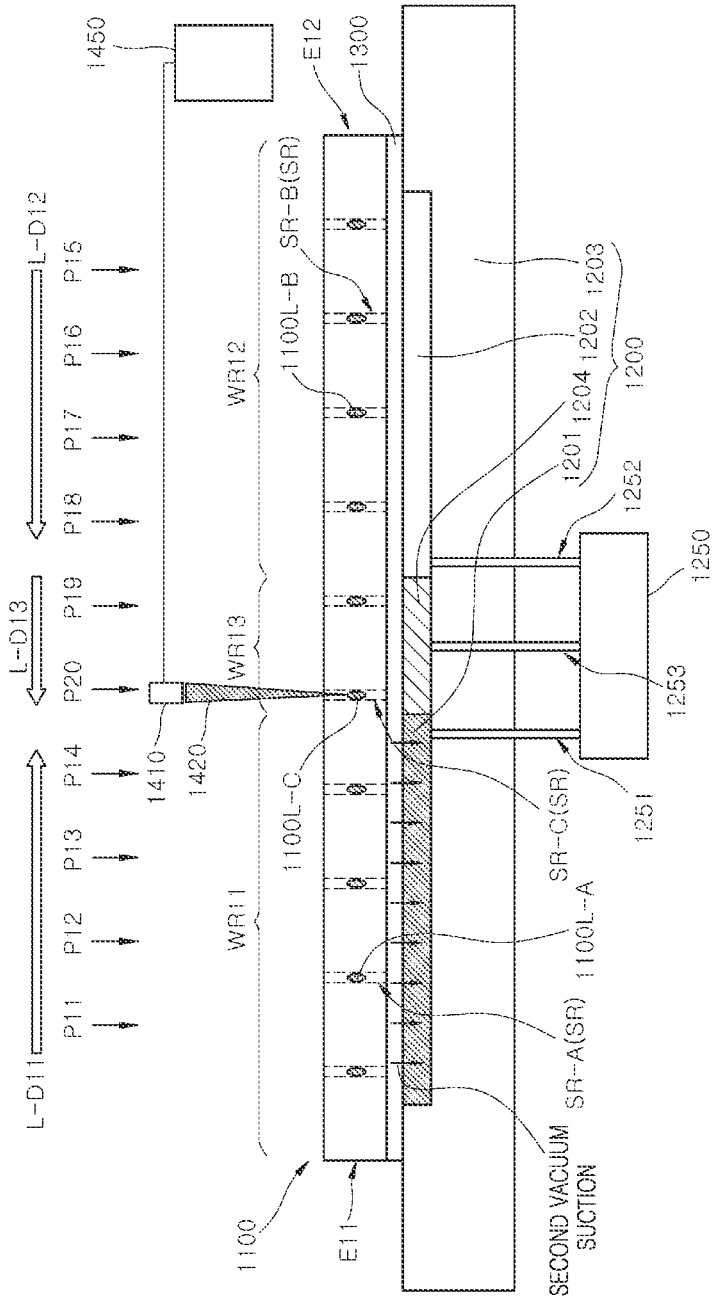
FIG. 18 is a view illustrating a step of forming third modified portions in a wafer according to an embodiment of the present disclosure.

FIG. 18 is a view illustrating a step of forming third modified portions 1100L-C in the wafer 1100 according to an embodiment of the present disclosure.

Referring to FIGS. 18 and 14, a second chucking step S15 may be performed to fix the first portion WR11 of the wafer to the wafer chuck 1200 after the first and second modified portions 1100L-A and 1100L-B are formed. The second chucking step S15 may be performed without fixing the third and second portions WR13 and WR12 of the wafer to the wafer chuck 1200.

The second chucking step S15 may include fixing the first portion WR11 of the wafer to the first portion 1201 of the wafer chuck by second vacuum suction while releasing the first vacuum suction for the third portion WR13 of the wafer to the wafer chuck 1200. The chuck controller 1250 may operate to generate a vacuum suction force only in the first portion 1201 of the wafer chuck by opening the first vacuum path 1251 connected to the first portion 1201 of the wafer chuck and closing the second and third vacuum paths 1252 and 1253 connected to the second and third portions 1202 and 1204 of the wafer chuck, respectively. Accordingly, only the first portion WR11 of the wafer may be fixed to the first portion 1201 of the wafer chuck by second vacuum suction. The second and third portions WR12 and WR13 of the wafer may be freely movable without being fixed to the wafer chuck 1200.

In a third laser irradiation step S16, the third modified portions 100L-C may be sequentially formed in the third scribe lane regions SR-C along a third direction L-D13 from the second portion W12 of the wafer toward the first portion W11 of the wafer. The laser irradiator 1410 may sequentially irradiate lasers 1420 to the third scribe lane regions SR-C while sequentially moving in the third direction L-D13 from the second edge E12 of the wafer toward the first edge E11. The laser irradiator 1410 may sequentially irradiate the lasers 1420 to the third scribe lane regions SR-C while sequentially moving to the ninth and tenth positions P19 and P20.

After forming the first, second, and third modified portions 1100L-A, 1100L-B, and 1100L-C, cracks may be grown on the surface of the wafer 1100. The semiconductor chips may be separated (S17) from the wafer 1100 using the growth of the cracks In an embodiment, the cracks are grown to separate the semiconductor chips by stretching the lamination film 1300 to introduce tensile stress to the wafer 1100.

The present teachings have been described in conjunction with some presented embodiments. Those skilled in the art will appreciate that various modifications, additions, and substitutions are possible, without departing from the scope and spirit of the present disclosure. Accordingly, the embodiments disclosed in the present specification should be considered from not a restrictive standpoint but from an illustrative standpoint. The scope of the present teachings is not limited to the above descriptions but defined by the accompanying claims, and all of distinctive features in the equivalent scope should be construed as being included in the present teachings.

What is claimed is:

1. A method of dicing a wafer including a first portion extending from a first edge of the wafer toward a second edge of the wafer, including a second portion extending from the second edge of the wafer toward the first edge of the wafer, and further including first scribe lane regions disposed in the first portion of the wafer, the method comprising:
    loading the wafer on a wafer chuck;
    performing a first chucking of fixing the second portion of the wafer to the wafer chuck without fixing the first portion of the wafer to the wafer chuck;
    performing a first laser irradiating of sequentially forming first modified portions in the first scribe lane regions along a first direction from the first edge of the wafer toward the second edge of the wafer; and
    separating semiconductor chips from the wafer by growing cracks from the first modified portions to a surface of the wafer.

2. The method of claim 1, wherein the wafer further includes second scribe lane regions disposed in the second portion of the wafer, and the method further comprises:
    performing a second chucking of fixing the first portion of the wafer to the wafer chuck and unfixing the second portion of the wafer from the wafer chuck; and
    performing a second laser irradiating of sequentially forming second modified portions in the second scribe lane regions along a second direction from the second edge of the wafer toward the first edge of the wafer.

3. The method of claim 2, wherein performing the first chucking includes fixing the second portion of the wafer to a second portion of the wafer chuck by first vacuum suction.

4. The method of claim 3, wherein performing the second chucking includes:
    fixing the first portion of the wafer to a first portion of the wafer chuck by second vacuum suction; and
    unfixing the second portion of the wafer from the second portion of the wafer chuck by releasing the first vacuum suction.

5. The method of claim 2, wherein each of the first and second modified portions has a crystal state different from a crystal state of the wafer.

6. The method of claim 1,
wherein each of the first scribe lane regions includes first, second, and third sub-scribe lane regions,
wherein the first, second, and third sub-scribe lane regions are sequentially disposed from the first edge of the wafer to the second edge, and
wherein performing the first laser irradiating includes:
irradiating a first sub-laser to the first sub-scribe lane region;
irradiating a second sub-laser to the second sub-scribe lane region; and
irradiating a third sub-laser to the third sub-scribe lane region.

7. The method of claim 1, wherein separating the semiconductor chips from the wafer includes stretching the wafer to grow the cracks.

8. The method of claim 7, further comprising attaching a lamination film on a surface of the wafer facing the wafer chuck, wherein stretching the wafer includes stretching the lamination film.

9. A method of dicing a wafer including a first portion extending from a first edge of the wafer toward a second edge of the wafer, a second portion extending from the second edge toward the first edge of the wafer, and a third portion between the first and second portions of the wafer, and further including first, second, and third scribe lane regions disposed in the first, second, and third portions of the wafer, respectively, the method comprising:
loading the wafer on a wafer chuck;
performing a first chucking of fixing the third portion of the wafer to the wafer chuck without fixing the first and second portions of the wafer to the wafer chuck;
performing a first laser irradiating of sequentially forming first modified portions in the first scribe lane regions along a first direction from the first edge of the wafer toward the second edge of the wafer;
performing a second laser irradiating of sequentially forming second modified portions in the second scribe lane regions along a second direction from the second edge of the wafer toward the first edge of the wafer;
performing a second chucking of fixing the first portion of the wafer to the wafer chuck without fixing the second portion of the wafer to the wafer chuck and unfixing the third portion of the wafer from the wafer chuck;
performing a third laser irradiating of forming third modified portions in the third scribe lane regions along a third direction from the second edge of the wafer toward the first edge of the wafer; and
separating semiconductor chips from the wafer by growing cracks from the first, second, and third modified portions to a surface of the wafer.

10. The method of claim 9,
wherein the wafer chuck includes first, second, and third portions overlapped by the first, second, and third portions of the wafer, respectively, and
wherein performing the first wafer chucking includes fixing the third portion of the wafer to the third portion of the wafer chuck by first vacuum suction.

11. The method of claim 10, wherein performing the second chucking includes:
fixing the first portion of the wafer to the first portion of the wafer chuck by second vacuum suction; and
unfixing the third portion of the wafer from the third portion of the wafer chuck by releasing the first vacuum suction.

12. The method of claim 9, wherein each of the first, second, and third modified portions has a crystal state different from a crystal state of the wafer.

13. The method of claim 9, wherein separating the semiconductor chips from the wafer includes stretching the wafer to grow the cracks.

14. The method of claim 9, further comprising attaching a lamination film on a surface of the wafer facing the wafer chuck, wherein stretching the wafer includes stretching the lamination film.

15. A method of dicing a wafer comprises:
fixing a second portion of a wafer to a wafer chuck without fixing a first portion of the wafer to the wafer chuck;
forming first modified portions in first scribe lane regions of the first portion of the wafer by sequentially laser irradiating the first scribe lane regions without the first portion of the wafer being fixed to the wafer chuck;
fixing a first portion of the wafer to the wafer chuck and unfixing the second portion of the wafer from the wafer chuck; and
forming second modified portions in second scribe lane regions of the second portion of the wafer by sequentially laser irradiating the second scribe lane regions without the second portion of the wafer being fixed to the wafer chuck.

* * * * *